Figure 1:
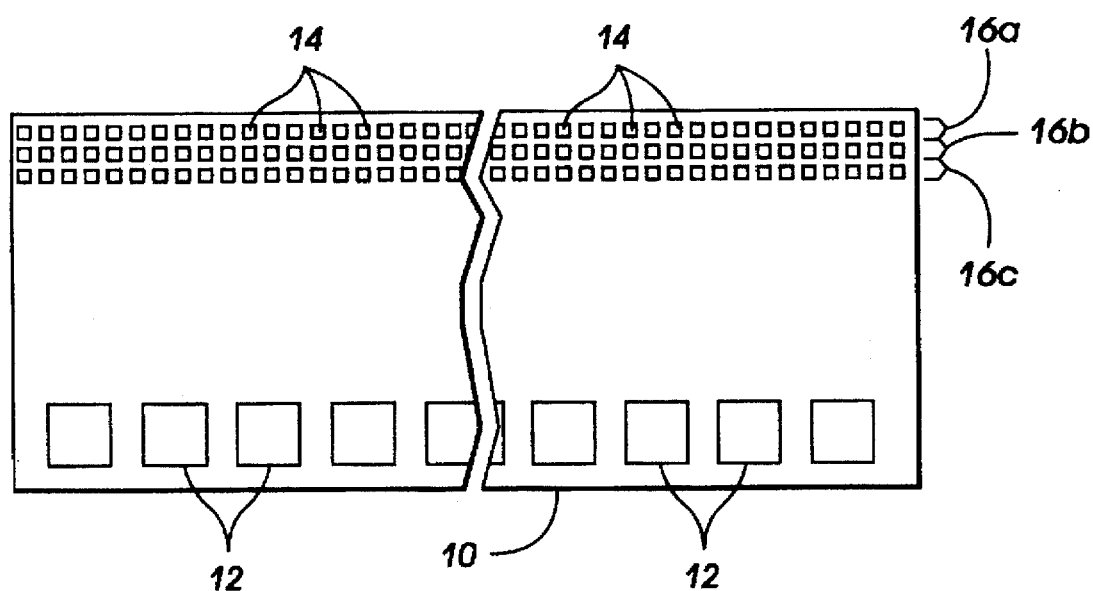

United States Patent [19]

Hosier et al.

[11] Patent Number: 5,691,760
[45] Date of Patent: Nov. 25, 1997

[54] PHOTOSENSITIVE SILICON CHIP HAVING PHOTOSITES SPACED AT VARYING PITCHES

[75] Inventors: Paul A. Hosier, Rochester; Jagdish C. Tandon, Fairport, both of N.Y.

[73] Assignee: Xerox Corporation, Stamford, Conn.

[21] Appl. No.: 542,246

[22] Filed: Oct. 12, 1995

[51] Int. Cl.$^6$ .................. B41J 2/45; H01L 27/00
[52] U.S. Cl. ........................ 347/238; 250/208.1
[58] Field of Search ............... 347/238, 42; 250/208.1, 250/578.1; 257/234, 88; 358/482

[56] References Cited

U.S. PATENT DOCUMENTS

| | | | |
|---|---|---|---|
| 4,251,822 | 2/1981 | Hara et al. | 347/209 |
| 4,644,411 | 2/1987 | Sato et al. | 358/294 |
| 4,814,667 | 3/1989 | Tanaka | 250/578.1 |
| 5,457,311 | 10/1995 | Drake et al. | 250/208.1 |
| 5,537,139 | 7/1996 | Ayaki et al. | 347/171 |

*Primary Examiner*—Benjamin R. Fuller
*Assistant Examiner*—Thinh Nguyen
*Attorney, Agent, or Firm*—R. Hutter

[57] ABSTRACT

In a hard-copy scanner in which a set of photosensitive silicon chips are abutted to form a single page-width array of photosensors, the photosites at the critical ends of each chip are irregularly spaced, relative to the other photosites on the chip. This irregular spacing enables compensation for imprecisions in the dimensions of individual chips. The spacing principle can be applied as well to LED's or portions of ink-jet ejectors.

15 Claims, 2 Drawing Sheets

PHOTOSENSITIVE SILICON CHIP HAVING PHOTOSITES SPACED AT VARYING PITCHES

The present invention relates to photosensitive chips for creating electrical signals from an original image, as would be found, for example, in a digital scanner or facsimile machine.

Image sensor arrays typically comprise a linear array of photosensors which raster scan an image bearing document and convert the microscopic image areas viewed by each photosensor to image signal charges. Following an integration period, the image signal charges are amplified and transferred as an analog video signal to a common output line or bus through successively actuated multiplexing transistors.

For high-performance image sensor arrays, a preferred design includes an array of photosensors of a width comparable to the width of a page being scanned, to permit one-to-one imaging generally without the use of reductive optics. In order to provide such a "full-width" array, however, relatively large silicon structures must be used to define the large number of photosensors. A preferred technique to create such a large array is to align several butted silicon chips, each chip defining a small linear array thereon. In one proposed design, an array is intended to comprise up to twenty silicon chips, butted end-to-end, each chip having 248 active photosensors spaced at 400 photosensors per inch.

The silicon chips which are butted to form a single full-width array are typically created by first creating the circuitry for a plurality of individual chips on a single silicon wafer. The silicon wafer is then cut, or "diced," around the circuit areas to yield discrete chips. Typically, the technique for dicing the chips includes a combination of chemical etching and mechanical sawing. Because, on each chip, the photosensors are spaced with high resolution from one end of a chip to the other, the length of each diced chip from one end of the array thereon to the other requires precision dicing. It would be desirable to dice each individual chip with a precise dimension along the linear array of photosensors, so that, when a series of chips are butted end-to-end to form a single page-width linear array, there is a minimum disruption of spacing from an end photosensor on one chip to a neighboring photosensor at the end of a neighboring chip. Ideally, the spacing, or pitch, across an entire full-width linear array should be consistent regardless of the configuration of silicon chips forming the array.

U.S. Pat. No. 4,644,411 discloses an extended image sensor comprising a plurality of linearly arranged line sensors, in the form of chips, each chip having a plurality of photosensors thereon. The photosites, that is the main photosensitive areas of the photosensors, positioned at the ends of the linear arrangement on each chip are smaller in width in the direction of the linear arrangement than the photosites positioned in the central portion of each chip. Thus, the smaller photosites at the ends of each chip can be spaced a fairly significant distance from the edge of each chip, thereby allowing some room for length variation among a large set of chips of the same design. Because the end photosites on each chip are made shorter along the length of the linear array, the end photosite is made slightly longer in the lead-and-trail direction of the linear array, so that the end photosite will have generally the same surface area as the regular photosites.

According to one aspect of the present invention, there is provided a photosensitive device, comprising a semiconductor chip. A plurality of regular photosites are defined on a surface of the chip, each regular photosite defining a perimeter, the regular photosites being arranged in a linear array with each regular photosite being spaced from the perimeter of a neighboring regular photosite by a predetermined first spacing distance. An end photosite is disposed at one end of the linear array, the end photosite defining a perimeter. A second-to-end photosite is disposed between the end photosite and a regular photosite in the linear array, the second-to-end photosite defining a perimeter. The perimeter of the end photosite is spaced from the perimeter of the second-to-end photosite by a predetermined second spacing distance, the second spacing distance being less than the first spacing distance.

According to another aspect of the present invention, there is provided a photosensitive device, comprising a semiconductor chip. A plurality of regular photosites are defined on a surface of the chip, each regular photosite defining a perimeter, the regular photosites being arranged in a linear array with each regular photosite being spaced from the perimeter of a neighboring regular photosite by a predetermined first spacing distance. An end photosite is disposed at one end of the linear array, the end photosite defining a perimeter. A second-to-end photosite is disposed between the end photosite and a regular photosite in the linear array, the second-to-end photosite defining a perimeter. The perimeter of each regular photosite and the perimeter of the end photosite and the perimeter of the second-to-end photosite all have identical dimensions. The perimeter of the end photosite is spaced from the perimeter of the second-to-end photosite by a predetermined second spacing distance, the second spacing distance being less than the first spacing distance.

According to another aspect of the present invention, there is provided a semiconductor chip. A plurality of regular structures is defined on a surface of the chip, each regular structure defining a perimeter, the regular structures being arranged in a linear array with each regular structure being spaced from the perimeter of a neighboring regular structure by a predetermined first spacing distance. An end structure is disposed at one end of the linear array, the end structure defining a perimeter. A second-to-end structure is disposed between the end structure and a regular structure in the linear array, the second-to-end structure defining a perimeter. The perimeter of the end structure is spaced from the perimeter of the second-to-end structure by a predetermined second spacing distance, the second spacing distance being less than the first spacing distance.

Figure 2:
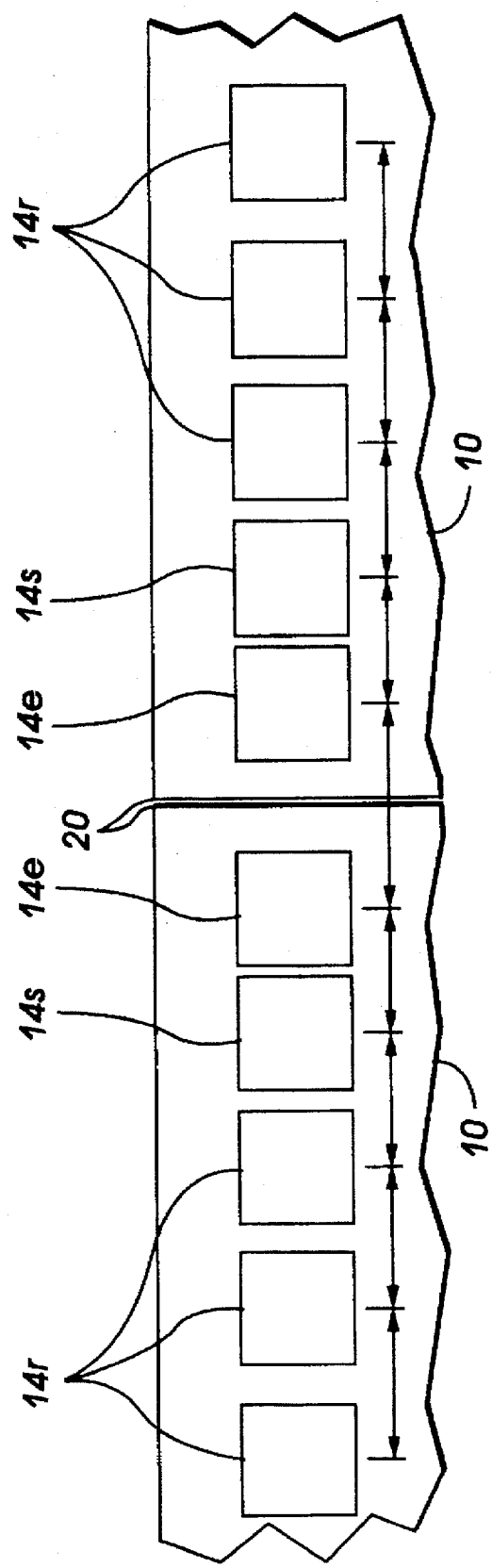

In the drawings:

FIG. 1 is a plan view of a single photosensitive chip of a general design found, for example, in a full-color scanner; and FIG. 2 is a detailed plan view of portions of two abutted chips, showing the relative spacings of representative photosites at neighboring ends thereof.

FIG. 1 is a plan view of a single photosensitive chip, generally indicated as 10, of a general design found, for example, in a full-color photosensor scanner. The basic elements of the chip 10 include any number of bonding pads, such as indicated as 12, and one or more linear arrays of photosites 14, each photosite being associated with a photosensor. A typical design of a full-page-width scanner will include a plurality of chips 10, each chip being approximately one-half to one inch in length, the chips being butted end-to-end to form an effective collinear array of photosensors, which extends across a page image being scanned. Generally, each individual photosensor is adapted to output a charge or voltage signal indicative to the intensity of light of a certain type impinging thereon; various structures, such as transfer circuits, or charge-coupled devices, are known in the art for processing signal output by the various photosensors corresponding to photosites 14.

As shown in the FIG. 1 embodiment, chip 10 is a silicon-based integrated circuit chip having defined in a main surface thereof three independently-functioning linear arrays of photosensors, each photosensor being here indicated as 14. The photosensors are disposed in three parallel rows which extend across a main dimension of the chip 10, these individual rows being shown as 16a, 16b, and 16c. Each individual row of photosensors on chip 10 can be made sensitive to a particular color, by applying to the particular row 16a, 16b, 16c a spectrally translucent filter layer which covers only the photosensors in a particular row. In a preferred embodiment of the present invention, the three rows of photosensors are each filtered with a different primary color, such as red, green, and blue.

According to the present invention, in order to maintain a desirable spacing of end photosites in an array such as, for example, row 16a, from the necessary high-precision edge of a main surface of a chip 10, the spacing of the last few photosites in the linear array on the chip can be selected to space the end photosite a sufficient distance from the edge of the surface of the chip, thereby providing room to accommodate inevitable inaccuracies in the critical dimension of each chip caused by the dicing process.

FIG. 2 is a plan view of relevant portions of two chips, each indicated as 10, abutting each other to form a single linear array from the linear array on each chip. Each photosite is of a generally rectangular shape, defining a perimeter, the perimeter of each photosite being spaced from the perimeter of a neighboring photosite by a spacing distance. As used in the claims herein, the "spacing distance" shall be considered the distance between a perimeter of one photosite to the nearest perimeter of a neighboring photosite in the same linear array. As shown in FIG. 2, only one linear array is shown in each chip. According to one preferred design of a photosensitive chip, for an image resolution of 400 spots per linear inch, each photosite has a dimension of 47.5 micrometers along the direction of extension of the linear arrays, and 63.5 micrometers along the direction perpendicular to the direction of extension of the linear arrays.

With reference to FIG. 2, each linear array of photosites includes a plurality of "regular" photosites, indicated as 14r. At one or both ends of the linear array on each chip 10, is an end photosite, such as indicated by 14e, and a second-to-end photosite, (referred to in the claims hereinbelow as a "next-to-end photosite") indicated as 14s, which is the photosite between the end photosite and the remainder of photosites such as 14r in the linear array. The two chips 10 are placed next to each other so that the linear arrays of photosites on each chip are joined to form a single linear array. The area where the two chips 10 meet is shown as abutment area 20; depending on the particular design of an input scanner, the neighboring chips 10 can be either in contact with each other, or else spaced by some slight distance.

As mentioned above, when assembling a series of chips 10 so that the linear arrays of photosites on each chip together form a single linear array, it is desirable that there be no artifacts in the linear array indicating the presence of a gap or joint between photosites on different chips. If, for example, there is a noticeable gap between each pair of adjacent chips in the linear array, the gap will affect the integrity of images recorded with the linear array. The critical dimension for each chip 10 is the total width of the chip from edge to edge of its main surface along the direction of the linear array; imprecisions in this critical dimension, caused by the mechanics of the dicing process, can result in unacceptable gaps between adjacent photosites on neighboring chips. At the same time, to place an end photosite too close to an edge of a chip could result in damage to the photosite during the dicing process. It is therefore desirable to provide an arrangement of photosites, in which the end photosites are spaced safely away from the edge of each chip, so that the photosite will not be damaged in the dicing process, while still avoiding any noticeable gaps between adjacent photosites in neighboring chips, which could result in noticeable artifacts in images recorded with the linear array.

According to the present invention, for each chip, one or more of the end photosites at either end of the linear array on the chip is spaced slightly irregularly, relative to the bulk of photosites on the chip. As shown in FIG. 2, while regular photosites 14r are of a certain regular spacing as shown by the arrows between centers of each photosite, the end photosite and second-to-end photosites 14e and 14s of each chip 10 are "squeezed together" relative to the rest of the photosites; that is, while the regular photosites 14r are spaced a first regular spacing distance apart, second-to-end photosite 14s and end photosite 14e on either chip are spaced at second and third spacing distances apart respectively, these spacing distances being shorter than the regular spacing distances for regular photosites 14r.

This squeezing together of second-to-end photosite 14s and end photosite 14e on each chip also results, as shown, in the end photosite 14e being spaced slightly further from the end of the chip, as shown at abutment area 20, than would be apparent if all of the photosites on each chip were spaced the same distance apart. This spacing of the end photosite 14e from the critical edge of the chip 10 serves to avoid damage to the photosite when the chip 10 is diced from a silicon wafer. Although this creates a slightly greater than normal gap between neighboring end photosites 14e on adjacent chips 10, the fact that the second-to-end photosites 14s on each chip 10 are also slightly "squeezed" to neighboring photosites 14r will have an effect of making the possibly-resulting artifact on a scanned image more gradual and therefore less conspicuous.

According to a preferred embodiment of the invention, for a 400 pixel per inch scanner, a preferred spacing between adjacent regular photosites 14r is approximately 16 micrometers, while a preferred spacing distance between end photosite 14e and second-to-end photosite 14s is approximately 14 micrometers. In this case, a preferred spacing distance between the parimeter of end photosite 14e and the edge of the chip 10 is 9–10 micrometers. Further, according to a variant of the present invention, a spacing between second-to-end photosite 14s and the neighboring regular photosite 14r is also less than the regular spacing distance, such as 14 micrometers, or alternatively, could be intermediate between the spacing distance of the end photosite and the spacing distance of the regular photosite, such as 15 micrometers. In all cases of this preferred embodiment, however, the dimension of all photosites, whether regular or otherwise, is the same along the direction of extension of the linear array.

Although the illustrated embodiment of the present invention is directed toward a photosensitive chip, it is conceivable that the principle of the present invention could be applied to any arrangement of abutting chips having repetitive structures thereon. In the place of photosites, there could be light emitting diodes, such as for an LED printbar, or even portions of an ink-jet printhead; such structures are recited in certain of the claims hereinbelow as "structures."

While this invention has been described in conjunction with various embodiments, it is evident that many alternatives, modifications, and variations will be apparent to those skilled in the art. Accordingly, it is intended to embrace all such alternatives, modifications, and variations as fall within the spirit and broad scope of the appended claims.

We claim:

1. A photosensitive device, comprising:

a semiconductor chip;

a plurality of regular photosites provided on a main surface of the chip, each regular photosite defining a perimeter, the regular photosites being arranged in a linear array with each regular photosite being spaced from the perimeter of a neighboring regular photosite by a predetermined first spacing distance;

an end photosite provided at one end of the linear array, said end photosite not included in said plurality of regular photosites, the end photosite defining a perimeter; and a next-to-end photosite provided between the end photosite and a regular photosite in the linear array, said next-to-end photosite not included in mid plurally of regular photosites, the next-to-end photosite defining a perimeter, the perimeter of the end photosite being spaced from the perimeter of the next-to-end photosite by a predetermined second spacing distance, the second spacing distance being less than the first spacing distance.

2. The device of claim 1, the perimeter of each regular photosite and the perimeter of the end photosite and the perimeter of the next-to-end photosite all having identical dimensions.

3. The device of claim 1, a distance between a perimeter of the end photosite and an edge of the surface of the chip being less than the second spacing distance.

4. The device of claim 1, the perimeter of the next-to-end photosite being spaced from the perimeter of a regular photosite in the linear array by a predetermined third spacing distance, the third spacing distance being less than the first spacing distance.

5. The device of claim 4, the third spacing distance being greater than the second spacing distance.

6. A photosensitive device, comprising:

a semiconductor chip;

a plurality of regular photosites provided on a main surface of the chip, each regular photosite defining a perimeter, the regular photosites housing arranged in a linear array with each regular photosite being spaced from the perimeter of a neighboring regular photosite by a predetermined first spacing distance;

an end photosite provide at one end of the linear array, said end photosite not included in said plurality of regular photosites, the end photosite defining a perimeter; and a next-to-end photosite provided between the and photosite and a regular photosite in the linear array, said next-to-end photosite not included in said plurality of regular photosites, the next-to-end photosite defining a perimeter, the perimeter of each regular photosite and the perimeter of the end photosite and the perimeter of the next-to-end photosite all having identical dimensions, the perimeter of the end photosite being spaced from the perimeter of the next-to-end photosite by a predetermined second spacing distance, the second spacing distance being less than the first spacing distance.

7. The device of claim 6, the perimeter of the next-to-end photosite being spaced from the perimeter of a regular photosite in the linear array by a predetermined third spacing distance, the third spacing distance being less than the first spacing distance.

8. The device of claim 6, a distance between a perimeter of the end photosite and an edge of the surface of the chip being less than the second spacing distance.

9. A semiconductor chip, comprising:

a plurality of physically-identical elements defined on a main surface of the chip, each element defining a perimeter, the elements being arranged in a linear array with each element being spaced from the perimeter of a neighboring element by a predetermined first spacing distance;

an end element disposed at one end of the linear array, said end element not included in said plurality of elements, the end element defining a perimeter; and a next-to-end structure disposed between the end element and an element in the linear array, said next-to-end element not included in said plurality of elements, the next-to-end element defining a perimeter, the perimeter of the end element being spaced from the perimeter of the next-to-end element by a predetermined second spacing distance, the second spacing distance being less than the first spacing distance.

10. The chip of claim 9, wherein each element is a light-emitting diode.

11. The chip of claim 9, wherein each element is a portion of an ink-jet ejector.

12. The chip of claim 9, a distance between a perimeter of the end element and an edge of the surface of the chip being less than the second spacing distance.

13. The chip of claim 9, the perimeter of each element and the perimeter of the end element and the perimeter of the next-to-end element all having identical dimensions.

14. The chip of claim 9, the perimeter of the next-to-end element being spaced from the perimeter of an element in the linear array by a predetermined third spacing distance, the third spacing distance being less than the first spacing distance.

15. The chip of claim 14, the third spacing distance being greater than the second spacing distance.

* * * * *